US006766498B2

(12) United States Patent
Sharma et al.

(10) Patent No.: US 6,766,498 B2
(45) Date of Patent: Jul. 20, 2004

(54) EXTRACTING WIRING PARASITICS FOR FILTERED INTERCONNECTIONS IN AN INTEGRATED CIRCUIT

(75) Inventors: Mahesh S. Sharma, Austin, TX (US); David M. Newmark, Austin, TX (US); Teja Singh, Austin, TX (US); Joshua A. Bell, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 6 days.

(21) Appl. No.: 10/229,716

(22) Filed: Aug. 28, 2002

(65) Prior Publication Data

US 2004/0044974 A1 Mar. 4, 2004

(51) Int. Cl.[7] .............................................. G06F 17/50
(52) U.S. Cl. ............................................. 716/5; 716/6
(58) Field of Search ..................... 716/1–18; 703/13–15

(56) References Cited

U.S. PATENT DOCUMENTS

| | | | |
|---|---|---|---|
| 5,790,835 A | 8/1998 | Case et al. | 395/500 |
| 5,828,580 A | 10/1998 | Ho | 364/489 |
| 5,872,952 A | 2/1999 | Tuan et al. | 395/500 |
| 5,878,053 A | 3/1999 | Koh et al. | 371/22.1 |
| 5,896,300 A | 4/1999 | Raghavan et al. | 264/491 |
| 6,128,768 A | 10/2000 | Ho | 716/5 |
| 6,182,269 B1 | 1/2001 | Laubhan | 716/5 |
| 6,212,492 B1 * | 4/2001 | Kuge | 703/15 |
| 6,230,299 B1 * | 5/2001 | McSherry et al. | 716/1 |
| 6,249,903 B1 | 6/2001 | McSherry et al. | 716/11 |
| 6,289,412 B1 | 9/2001 | Yuan et al. | 711/11 |
| 6,363,516 B1 * | 3/2002 | Cano et al. | 716/5 |
| 6,381,730 B1 | 4/2002 | Chang et al. | 716/5 |
| 6,393,602 B1 * | 5/2002 | Atchison et al. | 716/4 |
| 6,412,101 B1 | 6/2002 | Chang et al. | 716/10 |
| 6,421,814 B1 | 7/2002 | Ho | 716/5 |
| 6,473,887 B1 * | 10/2002 | Dewey et al. | 716/5 |
| 6,553,542 B2 * | 4/2003 | Ramaswamy et al. | 716/2 |

* cited by examiner

*Primary Examiner*—Vuthe Siek
(74) *Attorney, Agent, or Firm*—Robert A. Voigt, Jr.; Winstead Sechrest & Minick P.C.

(57) ABSTRACT

A method, system and computer program product for extracting parasitic resistance and capacitance values to simulate performance of an integrated circuit. A selected number of interconnections in an integrated circuit may be identified ("interconnections of interest"). A netlist containing a list of the transistors in the integrated circuit may be pruned by selecting those transistors in the netlist that are in the channel connected regions on the driving side of the interconnections of interest and those on the receiving side of the interconnections of interest. Parasitic resistance and capacitance values for layout layers connected to the interconnections of interest may be extracted. These extracted parasitic resistance and capacitance values may be associated with the transistors connected to those layout layers in the pruned netlist. By extracting parasitic resistance and capacitance values as describe above, less compute-intensive RC extractions may be made thereby using less memory and processing power.

27 Claims, 3 Drawing Sheets

EXTRACTING WIRING PARASITICS FOR FILTERED INTERCONNECTIONS IN AN INTEGRATED CIRCUIT

TECHNICAL FIELD

The present invention relates to the field of electronic design automation, and more particularly to extracting the parasitic resistances and capacitances of selected interconnections in an integrated circuit using less memory and processing power than in prior art.

BACKGROUND INFORMATION

A field, commonly referred to as "Electronic Design Automation (EDA)", has evolved to handle the demanding and complicated task of designing semiconductor integrated circuits. EDA may refer to using a computer to design and simulate the performance of electronic circuits on an integrated circuit, commonly referred to as a "chip". Computers may be ideally suited to perform tasks associated with the design process because computers can be programmed to reduce or decompose large, complicated circuits into a multitude of simpler functions.

After the circuit for a semiconductor chip has been designed and physically laid out, the operation of the integrated circuit may be tested to verify the chip is working properly. One of the tests may be to characterize the parasitic effects associated with the interconnections, i.e., the wiring or nets, between electronic devices, e.g., transistors, in the chip. That is, one of the tests may be to characterize the wiring resistance and capacitance parasitics referred to herein as "Resistance Capacitance (RC) extraction". These wiring parasitic effects arise from the semiconductor manufacturing process. Wiring parasitics are important to characterize because they impact the delay of electronic signals from one point to another point in the chip and hence may impact the processing speed. Signals may take a longer time to propagate from one point to another point in the chip by the resistances and/or capacitances imposed upon the signal path. Further, parasitic effects may impact what is commonly referred to as "electromigration." Electromigration may refer to the problem of having the metal in the signal lines migrate along the path of the current flow over time. Eventually over a period of time, e.g., several years, this electromigration may result in an open circuit so that the signal is interrupted in the signal path thereby causing the chip to fail. High current density which may cause electromigration may result from a large capacitance load.

One method for characterizing the parasitic resistances and capacitances of the interconnections may be to assume that the parasitic resistance and capacitance for each metal layer in the interconnections to be a constant value per unit length. However, the actual parasitic effects in the lengths of interconnections are not constant per unit length but vary with metal line width, dielectric thickness and other fabrication and design characteristics. Therefore, the method may produce inaccurate results especially for interconnections comprising multiple complex interconnect layers.

More accurate methods for performing RC extraction have been developed by EDA vendors. For example, one software tool, commonly referred to as STAR-R software from AVANT! CORPORATION, performs RC extraction to calculate delay of electronic signals using a 4-step extraction process. First, a capacitance-only (C-only) extraction is performed on every interconnection in the design. Second, only resistance is extracted on every interconnection in the design (R-only). Third, delay calculations are performed to compare the R-only delay to the C-only delay. The delay calculations consume a significant amount of CPU time. On an interconnection by interconnection basis, if the difference between the R-only delay and the C-only delay exceeds a certain error criteria, the interconnection is identified for detailed parasitic RC extraction. Fourth, detailed extraction is performed on the identified interconnections using a distributed impedance model to address the complexity of the narrow metal spacing and other deep submicron effects. While EDA vendors may have developed tools that more accurately performs RC extractions, these tools require compute-intensive RC extractions for each interconnection thereby requiring a significant amount of memory and processing power.

It would therefore be desirable to develop a tool that accurately simulates performance of the integrated circuit yet avoids compute-intensive RC extractions for each interconnection by performing RC extractions on selected interconnections in an integrated circuit thereby using less memory and processing power than in prior art.

SUMMARY

The problems outlined above may at least in part be solved in some embodiments by identifying a selected number of interconnections in the integrated circuit ("interconnections of interest") and pruning a netlist containing a list of the transistors in the integrated circuit by selecting only those transistors in the netlist that are in the channel connected regions on the driving side of the interconnections of interest and those on the receiving side of the interconnections of interest. Parasitic resistance and capacitance values for layout layers connected to the interconnections of interest may be extracted. These extracted parasitic resistance and capacitance values may then be associated with the transistors connected to those layout layers in the pruned netlist. By using a pruned netlist of transistors in channel connected regions on the driving side of the interconnections of interest and transistors on the receiving side of the interconnections of interest, less compute-intensive RC extractions may be made thereby using less memory and processing power than in prior art. Furthermore, by associating the parasitic capacitance and resistance values of each of the extracted layout layers to each of the transistors in the pruned netlist, an accurate simulation of the performance of the integrated circuit may be made.

In one embodiment of the present invention, a method for extracting parasitic resistance and capacitance values to simulate performance of an integrated circuit may comprise the step of identifying a particular interconnection ("interconnection of interest"). Transistor(s) in channel connected region(s) on the driving side of the interconnection of interest and transistor(s) on the receiving side of the interconnection of interest may then be identified. That is, transistor(s) in channel connected regions(s) that are connected to the driving side of the interconnection of interest and transistor(s) connected to the receiving side of the interconnection of interest may be identified.

The layout layers connected to the interconnection of interest may then be extracted from the overall layout of the integrated circuit. That is, anything electrically connected to the interconnection of interests may be extracted. The parasitic capacitance and resistance values for each of the extracted layout layers may be extracted. The extracted parasitic capacitance and resistance values for each of the extracted layout layers may be associated with the identified transistor(s) on the driving side and on the receiving side of the identified interconnection of interest.

The foregoing has outlined rather broadly the features and technical advantages of one or more embodiments of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

It is noted that even though the following discusses extracting parasitic resistance and capacitance values for performing a delay and an electromigration analysis that the principles of the present invention as outlined below may be applied to other types of analyses, e.g., power grid voltage drop analysis, clock network analysis, coupling analysis. It is further noted a person of ordinary skill in the art would be capable of applying the principles of the present invention to these types of analyses. It is further noted that embodiments performing such analyses would fall within the scope of the present invention. It is further noted that parasitic capacitance or parasitic resistance may simply be referred to as "capacitance" or "resistance", respectively, for ease of readability.

Figure 1:
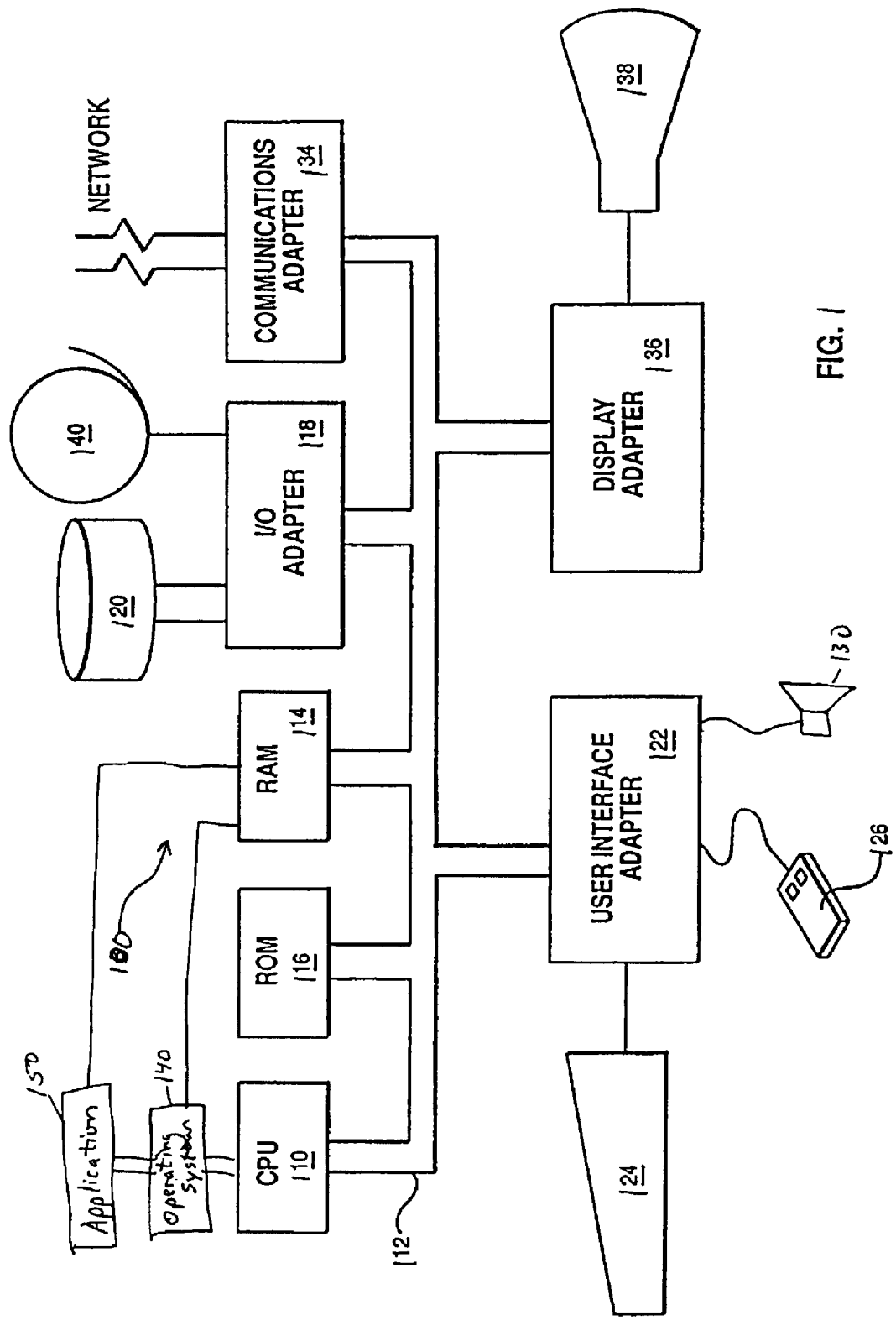
FIG. 1 illustrates a computer system configured in accordance with the present invention.

FIG. 1—Hardware Configuration of Computer System

FIG. 1 illustrates a typical hardware configuration of a computer system 100, e.g., workstation, which is representative of a hardware environment for practicing the present invention. Computer system 100 may have a processor 110 coupled to various other components by system bus 112. An operating system 140 may run on processor 110 and provide control and coordinate the functions of the various components of FIG. 1. An application 150 in accordance with the principles of the present invention may run in conjunction with operating system 140 and provide calls to operating system 140 where the calls implement the various functions or services to be performed by application 150. Application 150 may include, for example, a program for extracting parasitic resistance and capacitance values for analyzing delay as discussed in conjunction with FIG. 2, a program for extracting parasitic resistance and capacitance values for analyzing electromigration as discussed in conjunction with FIG. 3. Read-Only Memory (ROM) 116 may be coupled to system bus 112 and include a basic input/output system ("BIOS") that controls certain basic functions of computer system 100. Random Access Memory (RAM) 114 and disk adapter 118 may also be coupled to system bus 112. It should be noted that software components including operating system 140 and application 150 may be loaded into RAM 114 which may be computer system's 100 main memory for execution. Disk Adapter 118 may be a small computer system interface ("SCSI") adapter that communicates with a disk unit 120, e.g., disk drive. It is noted that the program of the present invention for extracting parasitic resistance and capacitance values for analyzing delay, as discussed in conjunction with FIG. 2, may reside in disk unit 120 or in application 150. It is further noted that the program of the present invention for extracting parasitic resistance and capacitance values for analyzing electromigration, as discussed in conjunction with FIG. 3, may reside in disk unit 120 or in application 150.

Referring to FIG. 1, computer system 100 may further comprise a communications adapter 134 coupled to bus 112. Communications adapter 134 may interconnect bus 112 with an outside network, e.g., Local Area Network (LAN), Wide Area Network (WAN), enabling computer system 100 to communicate with other such systems. Input/Output (I/O) devices may also be connected to system bus 112 via a user interface adapter 122 and a display adapter 136. Keyboard 124, mouse 126 and speaker 130 may all be interconnected to bus 112 through user interface adapter 122. Event data may be inputted to computer system 100 through any of these devices. A display monitor 138 may be connected to system bus 112 by display adapter 136. In this manner, a user is capable of inputting to computer system 100 through keyboard 124 or mouse 126 and receiving output from computer system 100 via display 138.

Implementations of the invention include implementations as a computer system programmed to execute the method or methods described herein, and as a computer program product. According to the computer system implementations, sets of instructions for executing the method or methods are resident in the random access memory 114 of one or more computer systems configured generally as described above. Until required by computer system 100, the set of instructions may be stored as a computer program product in another computer memory, for example, in disk drive 120 (which may include a removable memory such as an optical disk or floppy disk for eventual use in disk drive 120). Furthermore, the computer program product can also be stored at another computer and transmitted when desired to the user's workstation by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change.

Figure 2:
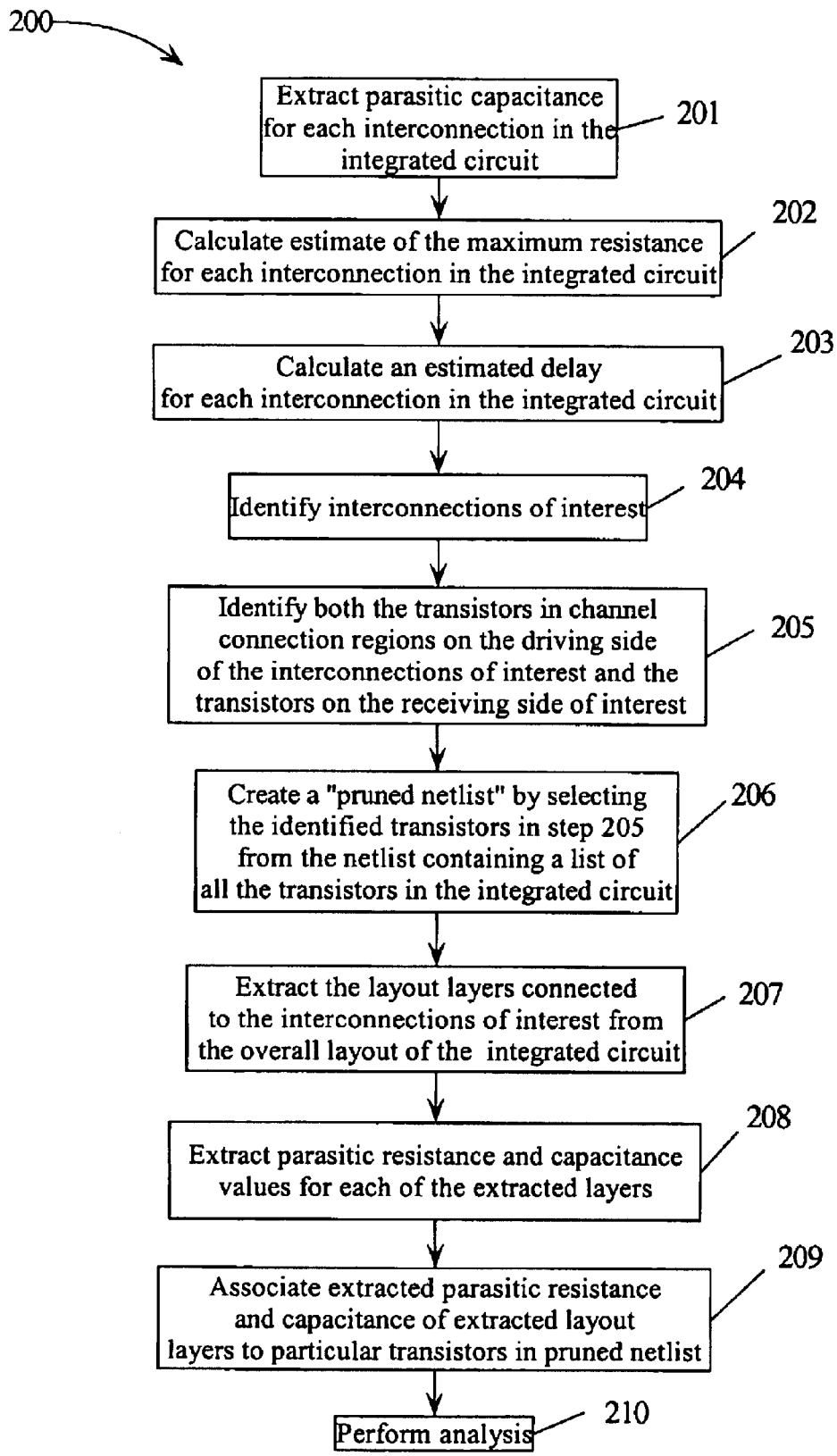
FIG. 2 is a flowchart of a method for extracting parasitic resistance and capacitance values for performing a delay analysis in accordance with the present invention.

FIG. 2—Method for Extracting Parasitic Resistance and Capacitance Values for Analyzing Delay FIG. 2 is a flowchart of one embodiment of the present invention of a method 200 for extracting parasitic resistance and capacitance values to simulate performance of an integrated circuit in order to analyze delay. As stated in the Background Information section, while Electronic Design Automation (EDA) vendors may have developed tools that more accurately perform Resistor Capacitance (RC) extractions than previous methods, these tools require compute-intensive RC extractions for each interconnection in the integrated circuit thereby requiring a significant amount of memory and processing power. It would therefore be desirable to develop a tool that accurately simulates performance of the integrated circuit yet avoids compute-intensive RC extractions for each interconnection by performing RC extractions on selected interconnections in an integrated circuit thereby using less memory and processing power than in prior art. Method 200 is a method that accurately simulates performance of an integrated circuit while avoiding compute-intensive RC extractions for each interconnection in the integrated circuit thereby using less memory and processing power than in prior art. It is noted that FIG. 2 illustrates one type of analysis, e.g., delay analysis, that may be performed on the integrated circuit upon performing RC extractions as discussed below. It is noted that other types of analyses, e.g., power grid voltage drop analysis, coupling analysis, may be performed on the integrated circuit upon performing RC extractions as discussed below and that those types of analyses would be recognized by an artisan of ordinary skill in the art. It is further noted that embodiments performing such analyses would fall within the scope of the present invention.

Referring to FIG. 2, in conjunction with FIG. 1, in step 201, parasitic capacitance for each interconnection, i.e., net, in an integrated circuit may be extracted. That is, the parasitic capacitance for each interconnection may be measured using a software tool such as "Vampire" which is manufactured by Candace Design Systems, Inc. (Candace Design Systems, Inc. is located at 2655 Seely Avenue, San Jose, Calif. 95134). An interconnection may refer to a wire or net between electronic devices, e.g., transistors, in an integrated circuit.

In step 202, an estimate of the maximum resistance for each interconnection in the integrated circuit may be calculated. In one embodiment, an estimate of the maximum resistance of an interconnection may be calculated by using the following equation:

$$Rest=(intCap*metaRes)/(minMetalCap*minWireWidth) \quad (EQ2),$$

where Rest is the estimated maximum resistance of the interconnection; where intCap is the extracted parasitic capacitance for the interconnection obtained in step 201; where metalRes is an estimated resistivity of the interconnection; where minMetalCap is an estimated minimum capacitance of the interconnection; and where minWireWidth is an estimated minimum width of the interconnection. The estimated resistivity, minimum capacitance and minimum width of the interconnection may be obtained from the resistivity, capacitance and interconnection width values received from the fabrication process.

In step 203, an estimated delay may be calculated for each interconnection in the integrated circuit using the following equation:

$$Delayest=0.5*Rest*intCap+Rest*Cgate \quad (EQ2),$$

where Delayest is the estimated delay of an electronic signal from one point to another point in the interconnection; and where Cgate is the estimated total capacitance of each gate of each transistor connected to the interconnection. The estimated total capacitance of each gate of each transistor connected to the interconnection may be obtained from the fabrication process.

In another embodiment of the present invention, the estimated delay of an electronic signal from one point to another point in an interconnection may be determined by calculating an estimated capacitance and an estimated resistance of the interconnection as described below.

The capacitance of an interconnection may be estimated using the following equation:

$$Capest=(maxDist*maxMetalCap) \quad (EQ3),$$

where Capest is the estimated capacitance of the interconnection; where maxDist is an estimate of the maximum distance of the interconnection; and where maxMetalCap is the estimated maximum capacitance of the interconnection. The estimated maximum distance may be obtained from the layout and the maximum capacitance of the interconnection may be obtained from the fabrication process.

The resistance of an interconnection may be estimated using the following equation:

$$Rest=(maxDist*metalRes)/minWireWidth \quad (EQ4),$$

where Rest is the estimated resistance of the interconnection; where metalRes is an estimated resistivity of the interconnection; and where minWireWidth is an estimated minimum width of the interconnection.

Using the results of EQ3 and EQ4, the estimated delay of an electronic signal from one point to another point in the interconnection in the integrated circuit may be calculated using the following equation:

$$Delayest=0.5*Rest*Capest+Rest*Cgate \quad (EQ5),$$

where Delayest is the estimated delay of an electronic signal from one point to another point in the interconnection; and where Cgate is the estimated total capacitance of each gate of each transistor connected to the interconnection.

In step 204, interconnections of interests may be identified. In one embodiment, interconnections of interest may be identified if the estimated delay of the electronic signal from one point to another point in the interconnection calculated in step 203 exceeds a pre-selected threshold value.

In step 205, transistor(s) in channel connected region(s) on the driving side of the interconnections of interest and transistor(s) on the receiving side of the interconnections of interest may be identified. That is, transistor(s) in channel connected regions(s) that are connected to the driving side of the interconnections of interest and transistor(s) connected to the receiving side of the interconnections of interest may be identified. The driving side of an interconnection may refer to the side of the interconnection where an electronic signal emanates from a driver. The receiving side of an interconnection may refer to the side of the interconnection where an electronic signal exits to be received by a receiver. A channel connected region may refer to an array of transistors connected between the interconnection of interest and the power supply and ground rails.

In step 206, a netlist containing a listing of all the transistors in the integrated circuit may be pruned by selecting the transistors identified in step 205 in the netlist to create a smaller list of transistors. By pruning the netlist to create a smaller list of transistors, less compute-intensive RC extractions may be made as detailed below thereby using less memory and processing power than in prior art. Further, by selecting transistor(s) in channel connected region(s) on the driving side of the interconnections of interest and transistor(s) on the receiving side of the interconnections of interest, the performance of the integrated circuit may be accurately simulated as detailed below.

In step 207, the layout layers connected to the interconnections of interest may be extracted from the overall layout of the integrated circuit. That is, anything electrically connected to the interconnections of interests may be extracted. For example, the vias connected to the interconnections of interest may be extracted. In another example, the metal contacts for the interconnections of interest may be extracted. Layout layers connected to the interconnections of interest may be extracted using a variety of commercially available software tools such as Vampire. In one embodiment of the present invention, coordinates of the transistors connected to the extracted layout layers may be obtained while extracting the layout layers connected to the interconnections of interest. These coordinates may indicate the location of the transistors in the overall layout of the integrated circuit. These coordinates may be used to associate the parasitic capacitance and resistance values for each of the extracted layout layers to particular transistors in the pruned netlist as discussed below.

In step 208, the parasitic capacitance and resistance values for each of the extracted layout layers may be extracted. The parasitic capacitance and resistance for each of the extracted layout layers may be extracted, i.e., measured, using a variety of commercially available software tools such as Vampire.

In step 209, the extracted parasitic capacitance and resistance values of each of the extracted layout layers may be associated with particular transistors in the pruned netlist. As stated above, in step 207, the coordinates of transistors connected to the extracted layout layers may be obtained. By having these coordinates, the extracted parasitic capacitance and resistance values of each of the extracted layout layers may be associated with each of the transistors connected to those extracted layout layers in the pruned netlist.

By using a pruned netlist of transistors in channel connected regions on the driving side of the interconnections of interest and transistors on the receiving side of the interconnections of interest, less compute-intensive RC extractions may be made as detailed below thereby using less memory and processing power than in prior art. Further, by associating the parasitic capacitance and resistance values of each of the extracted layout layers to each of the transistors in the pruned netlist, an accurate simulation of the performance of the integrated circuit may be made.

In step 210, an analysis may be performed. For example, an analysis on the delay of electronic signals in the integrated circuit may be performed. It is noted that determining the delay of electronic signals in an integrated circuit using extracted parasitic capacitance and resistance values is well known in the art and therefore will not be described in detail for sake of brevity. It is noted that other analyses, e.g., power grid voltage drop analysis, clock network analysis, coupling analysis, electromigration, may be performed using the principles of the present invention as described above. For example, the performance of an integrated circuit using the principles of the present invention as described above may be simulated to test for electromigration as discussed further below in conjunction with FIG. 3.

It is noted that method 200 may be executed in a different order presented and that the order presented in the discussion of FIG. 2 is illustrative. It is further noted that certain steps in FIG. 2 may be executed almost concurrently.

Figure 3:
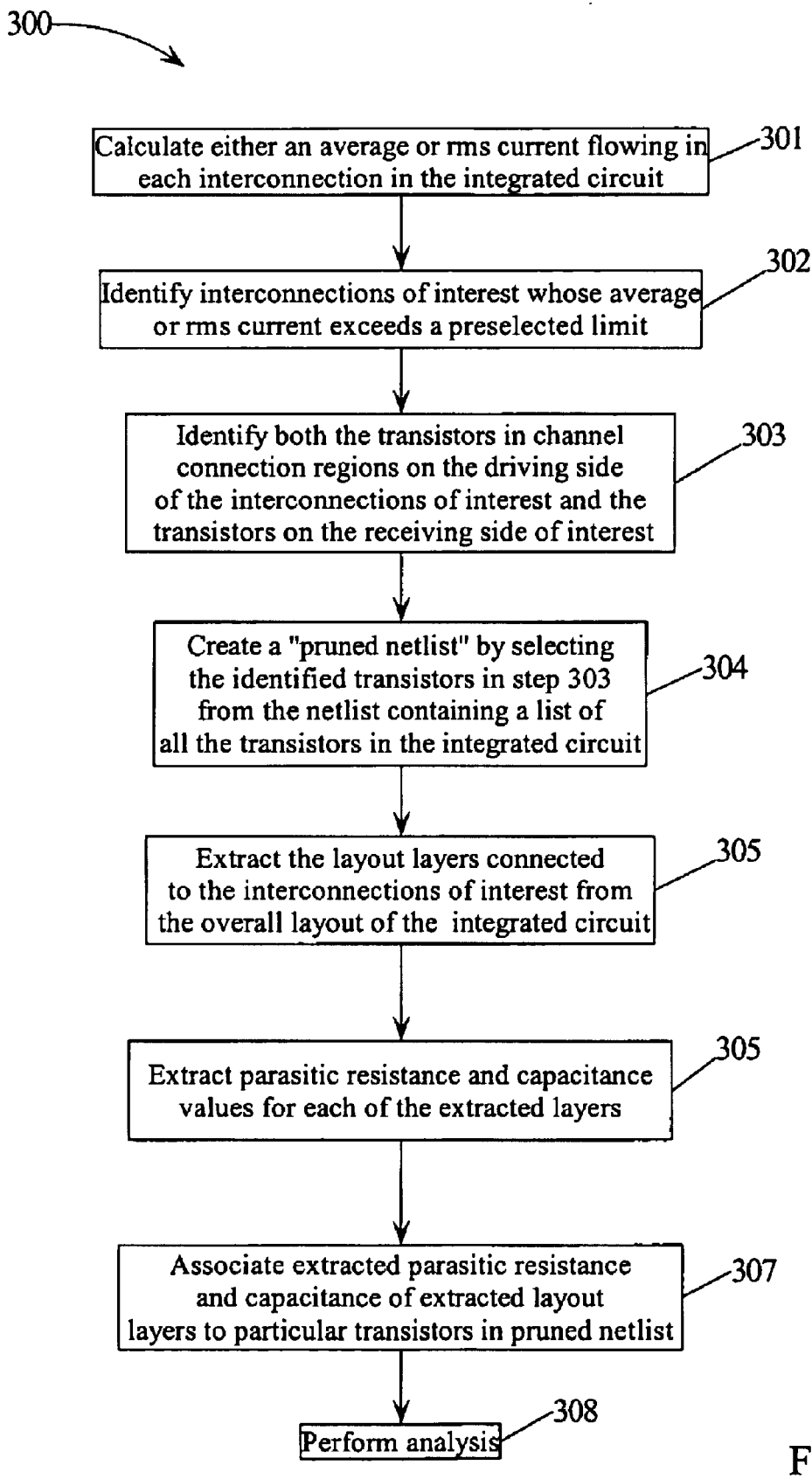
FIG. 3 is a flowchart of a method for extracting parasitic resistance and capacitance values for performing an electromigration analysis in accordance with the present invention.

FIG. 3—Method for Extracting Parasitic Resistance and Capacitance Values for Analyzing Electromigration FIG. 3 is a flowchart of one embodiment of the present invention of a method 300 for extracting parasitic resistance and capacitance values to simulate performance of an integrated circuit in order to analyze electromigration.

Referring to FIG. 3, in conjunction with FIG. 1, in step 301, an estimated average or a root mean square (rms) current flowing through each interconnection in the integrated circuit may be calculated. In one embodiment, the average current flowing through an interconnection may be calculated using the following equation:

$$Iave = crossMult * maxCap * Vdd * frequency * toggle \quad (EQ6),$$

where Iave is the estimated average current flowing through the interconnection; where crossMult is a scaled value of the cross-over current (cross-over current may refer to the current flowing directly from the power supply to ground through the interconnection); where maxCap is the estimated maximum capacitance of the interconnection; where Vdd is the voltage of the power supply; where frequency is the frequency of the clock associated with the interconnection; and where toggle is a user defined value based on the switching activity of a signal, e.g., 1 for clocks and dynamic gates and 0.5 for data signals since data signals switch half the rate as clocks and dynamic gates.

In one embodiment of the present invention, the rms current flowing through an interconnection may be calculated using the following equation:

$$Irms = \text{square root } (\text{\textfrac{4}{3}}) * maxCap * crossMult * vdd * \text{square root}(1/(frequency*toggle0)) * \text{square root}(trf) \quad (EQ 7),$$

where Irms is the root mean square of the current flowing through the interconnection; and where trf is the rise time of the signal, e.g., clock signal.

In step 302, interconnections of interests may be identified. In one embodiment, interconnections of interest may be identified if the estimated average current or the estimated rms current calculated in step 301 exceeds a pre-selected threshold value.

In step 303, transistor(s) in channel connected region(s) on the driving side of the interconnections of interest and transistor(s) on the receiving side of the interconnections of interest may be identified. That is, transistor(s) in channel connected regions(s) that are connected to the driving side of the interconnections of interest and transistor(s) connected to the receiving side of the interconnections of interest may be identified. The driving side of an interconnection may refer to the side of the interconnection where an electronic signal emanates from a driver. The receiving side of an interconnection may refer to the side of the interconnection where an electronic signal exits to be received by a receiver. A channel connected region may refer to an array of transistors connected between the interconnection of interest and the power supply and ground rails.

In step 304, a netlist containing a listing of all the transistors in the integrated circuit may be pruned by selecting the transistors identified in step 205 in the netlist to create a smaller list of transistors. By pruning the netlist to create a smaller list of transistors, less compute-intensive RC extractions may be made as detailed below thereby using less memory and processing power than in prior art. Further, by selecting transistor(s) in channel connected region(s) on the driving side of the interconnections of interest and transistor(s) on the receiving side of the interconnections of interest, the performance of the integrated circuit may be accurately simulated as detailed below.

In step 305, the layout layers connected to the interconnections of interest may be extracted from the overall layout of the integrated circuit. That is, anything electrically connected to the interconnections of interests may be extracted. For example, the vias connected to the interconnections of interest may be extracted. In another example, the metal contacts for the interconnections of interest may be extracted. Layout layers connected to the interconnections of interest may be extracted using a variety of commercially available software tools such as Vampire. In one embodiment of the present invention, coordinates of the transistors connected to the extracted layout layers may be obtained while extracting the layout layers connected to the interconnections of interest. These coordinates may indicate the location of the transistors in the overall layout of the integrated circuit. These coordinates may be used to associate the parasitic capacitance and resistance values for each of the extracted layout layers to particular transistors in the pruned netlist as discussed below.

In step 306, the parasitic capacitance and resistance values for each of the extracted layout layers may be extracted. The parasitic capacitance and resistance for each of the extracted layout layers may be extracted, i.e., measured, using a variety of commercially available software tools such as Vampire.

In step 307, the extracted parasitic capacitance and resistance values of each of the extracted layout layers may be associated with particular transistors in the pruned netlist. As stated above, in step 305, the coordinates of the transistors connected to the extracted layout layers may be obtained. By having these coordinates, the extracted parasitic capacitance and resistance values of each of the extracted layout layers may be associated with each of the transistors connected to those extracted layout layers in the pruned netlist.

By using a pruned netlist of transistors in channel connected regions on the driving side of the interconnections of interest and transistors on the receiving side of the interconnections of interest, less compute-intensive RC extractions may be made as detailed below thereby using less memory and processing power than in prior art. Further, by associating the parasitic capacitance and resistance values of each of the extracted layout layers to each of the transistors in the pruned netlist, an accurate simulation of the performance of the integrated circuit may be made.

In step 308, an analysis may be performed. For example, electromigration may be tested in an integrated circuit using method 300. It is noted that testing for electromigration in an integrated circuit using extracted parasitic capacitance and resistance values is well known in the art and therefore will not be described in detail for sake of brevity.

It is noted that method 300 may be executed in a different order presented and that the order presented in the discussion of FIG. 3 is illustrative. It is further noted that certain steps in FIG. 3 may be executed almost concurrently.

Although the system, computer program product and method are described in connection with several embodiments, it is not intended to be limited to the specific forms set forth herein; but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. A method for extracting parasitic resistance and capacitance values to simulate performance of an integrated circuit comprising the steps of:

identifying an interconnection in an integrated circuit;

identifying one or more transistors in one or more channel connected regions on a driving side of said identified interconnection;

identifying one or more transistors on a receiving side of said identified interconnection;

extracting layout layers connected to said identified interconnection from an overall layout of said integrated circuit;

extracting parasitic resistance and capacitance values for each of said extracted layout layers; and associating said extracted resistance and capacitance values for each of said extracted layout layers with said identified one or more transistors on said driving side and on said receiving side of said identified interconnection.

2. The method as recited in claim 1, wherein said interconnection is identified based on an estimated delay exceeding a threshold value.

3. The method as recited in claim 2, wherein said step of identifying said interconnection in said integrated circuit based on said estimated delay comprises the steps of:

extracting a parasitic capacitance for said interconnection in said integrated circuit;

calculating an estimate of a maximum resistance for said interconnection in said integrated circuit; and calculating an estimated delay using said extracted parasitic capacitance and said estimated maximum resistance.

4. The method as recited in claim 3, wherein said estimate of said maximum resistance is equal to the equation:

$$Rest = (intCap * metalRes)/(minMetalCap * minWireWidth)$$

wherein Rest is said estimate of said maximum resistance;

wherein intCap is said extracted parasitic capacitance;

wherein metalRes is an estimated resistivity of said identified interconnection;

wherein minMetalCap is an estimated minimum capacitance of said identified interconnection; and wherein minWireWidth is an estimated minimum width of said identified interconnection.

5. The method as recited in claim 4, wherein said estimated delay is equal to the equation:

$$Delayest = 0.5 * Rest * intCap + Rest * Cgate$$

wherein Delayest is said estimated delay; and wherein Cgate is an estimated total capacitance of each gate of each transistor connected to said identified interconnection.

6. The method as recited in claim 1, wherein said interconnection is identified based on an estimated current flow through said interconnection exceeding a threshold value.

7. The method as recited in claim 1 further comprising the step of:

selecting said identified one or more transistors on said driving side and said receiving side of said identified interconnection from a netlist of transistors in said integrated circuit to create a pruned netlist.

8. The method as recited in claim 7, wherein said extracted resistance and capacitance values for each of said extracted layout layers is associated with said identified one or more transistors on said driving side and said receiving side of said identified interconnection in said pruned netlist.

9. The method as recited in claim 1 further comprising the step of:

performing an analysis to test at least one or more of the following: delay and electromigration.

10. A computer program product embodied in a machine readable medium for extracting parasitic resistance and capacitance values to simulate performance of an integrated circuit comprising the programming steps of:

identifying an interconnection in an integrated circuit;

identifying one or more transistors in one or more channel connected regions on a driving side of said identified interconnection;

identifying one or more transistors on a receiving side of said identified interconnection;

extracting layout layers connected to said identified interconnection from an overall layout of said integrated circuit;

extracting parasitic resistance and capacitance values for each of said extracted layout layers; and associating said extracted resistance and capacitance values for each of said extracted layout layers with said identified one or more transistors on said driving side and on said receiving side of said identified interconnection.

11. The computer program product as recited in claim 10, wherein said interconnection is identified based on an estimated delay exceeding a threshold value.

12. The computer program product as recited in claim 11, wherein said programming step of identifying said interconnection in said integrated circuit based on said estimated delay comprises the programming steps of:
 extracting a parasitic capacitance for said interconnection in said integrated circuit;
 calculating an estimate of a maximum resistance for said interconnection in said integrated circuit; and
 calculating an estimated delay using said extracted parasitic capacitance and said estimated maximum resistance.

13. The computer program product as recited in claim 12, wherein said estimate of said maximum resistance is equal to the equation:

$$Rest=(intCap*metalRes)/(minMetalCap*minWireWidth)$$

wherein Rest is said estimate of said maximum resistance;
 wherein intCap is said extracted parasitic capacitance;
 wherein metalRes is an estimated resistivity of said identified interconnection;
 wherein minMetalCap is an estimated minimum capacitance of said identified interconnection; and
 wherein minWireWidth is an estimated minimum width of said identified interconnection.

14. The computer program product as recited in claim 13, wherein said estimated delay is equal to the equation:

$$Delayest=0.5*Rest*IntCap+Rest*Cgate$$

wherein Delayest is said estimated delay; and
 wherein Cgate is an estimated total capacitance of each gate of each transistor connected to said identified interconnection.

15. The computer program product as recited in claim 10, wherein said interconnection is identified based on an estimated current flow through said interconnection exceeding a threshold value.

16. The computer program product as recited in claim 10 further comprising the programming step of:
 selecting said identified one or more transistors on said driving side and said receiving side of said identified interconnection from a netlist of transistors in said integrated circuit to create a pruned netlist.

17. The computer program product as recited in claim 16, wherein said extracted resistance and capacitance values for each of said extracted layout layers is associated with said identified one or more transistors on said driving side and said receiving side of said identified interconnection in said pruned netlist.

18. The computer program product as recited in claim 10 further comprising the programming step of:
 performing an analysis to test at least one or more of the following: delay and electromigration.

19. A system, comprising:
 a memory unit operable for storing a computer program for extracting parasitic resistance and capacitance values to simulate performance of an integrated circuit; and
 a processor coupled to said memory unit, wherein said processor, responsive to said computer program, comprises
  circuitry operable for identifying an interconnection in said integrated circuit;
  circuitry operable for identifying one or more transistors in one or more channel connected regions on a driving side of said identified interconnection;
  circuitry operable for identifying one or more transistors on a receiving side of said identified interconnection;
  circuitry operable for extracting layout layers connected to said identified interconnection from an overall layout of said integrated circuit;
  circuitry operable for extracting parasitic resistance and capacitance values for each of said extracted layout layers; and
  circuitry operable for associating said extracted resistance and capacitance values for each of said extracted layout layers with said identified one or more transistors on said driving side and on said receiving side of said identified interconnection.

20. The system as recited in claim 19, wherein said interconnection is identified based on an estimated delay exceeding a threshold value.

21. The system as recited in claim 20, wherein said circuitry operable for identifying said interconnection in said integrated circuit based on said estimated delay comprises:
 circuitry operable for extracting a parasitic capacitance for said interconnection in said integrated circuit;
 circuitry operable for calculating an estimate of a maximum resistance for said interconnection in said integrated circuit; and
 circuitry operable for calculating an estimated delay using said extracted parasitic capacitance and said estimated maximum resistance.

22. The system as recited in claim 21, wherein said estimate of said maximum resistance is equal to the equation:

$$Rest=(intCap*metalRes)/(minMetalCap*minWireWidth)$$

wherein Rest is said estimate of said maximum resistance;
 wherein intCap is said extracted parasitic capacitance;
 wherein metalRes is an estimated resistivity of said identified interconnection;
 wherein minMetalCap is an estimated minimum capacitance of said identified interconnection; and
 wherein minWireWidth is an estimated minimum width of said identified interconnection.

23. The system as recited in claim 22, wherein said estimated delay is equal to the equation:

$$Delayest=0.5*Rest*intCap+Rest*Cgate$$

wherein Delayest is said estimated delay; and
 wherein Cgate is an estimated total capacitance of each gate of each transistor connected to said identified interconnection.

24. The system as recited in claim 19, wherein said interconnection is identified based on an estimated current flow through said interconnection exceeding a threshold value.

25. The system as recited in claim 19, wherein said processor further comprises:
 circuitry operable for selecting said identified one or more transistors on said driving side and said receiving side of said identified interconnection from a netlist of transistors in said integrated circuit to create a pruned netlist.

26. The system as recited in claim 25, wherein said extracted resistance and capacitance values for each of said extracted layout layers is associated with said identified one or more transistors on said driving side and said receiving side of said identified interconnection in said pruned netlist.

27. The system as recited in claim 19, wherein said processor further comprises:

circuitry operable for performing an analysis to test at least one or more of the following: delay and electromigration.

* * * * *